United States Patent
Nagase

(10) Patent No.: US 9,660,636 B2
(45) Date of Patent: May 23, 2017

(54) DRIVE DEVICE

(71) Applicant: DENSO CORPORATION, Kariya, Aichi-pref. (JP)

(72) Inventor: Takuo Nagase, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/117,480

(22) PCT Filed: Mar. 12, 2015

(86) PCT No.: PCT/JP2015/001366
§ 371 (c)(1),
(2) Date: Aug. 9, 2016

(87) PCT Pub. No.: WO2015/146041
PCT Pub. Date: Oct. 1, 2015

(65) Prior Publication Data
US 2016/0352319 A1 Dec. 1, 2016

(30) Foreign Application Priority Data

Mar. 27, 2014 (JP) .................................. 2014-066597

(51) Int. Cl.
*H03K 3/00* (2006.01)
*H03K 17/082* (2006.01)
(Continued)

(52) U.S. Cl.
CPC .......... *H03K 17/0828* (2013.01); *H02M 1/08* (2013.01); *H02M 1/32* (2013.01);
(Continued)

(58) Field of Classification Search
None
See application file for complete search history.

(56) References Cited

U.S. PATENT DOCUMENTS

| | | |
|---|---|---|
| 5,500,619 A | 3/1996 | Miyasaka |
| 6,222,403 B1 | 4/2001 | Mitsuda |

(Continued)

FOREIGN PATENT DOCUMENTS

| | | |
|---|---|---|
| JP | H03-040517 A | 2/1991 |
| JP | 2001-223571 A | 8/2001 |

(Continued)

*Primary Examiner* — Lincoln Donovan
*Assistant Examiner* — Khareem E Almo
(74) *Attorney, Agent, or Firm* — Posz Law Group, PLC

(57) ABSTRACT

A drive device includes: an on-side circuit turning on a power switching element; an off-side circuit turning off the power switching element; and a protection circuit controlling a gate current of the power switching element. The protection circuit includes: a constant-current circuit that defines a constant current for drawing a gate charge of the power switching element; a protection switch that controls electrical connection between the constant-current circuit and the gate of the power switching element; and a collector current detector. The collector current detector turns off the on-side circuit to disconnect the power switching element from the main power supply, and turns on the protection switch after a predetermined time has elapsed from when the current value of the collector current of the power switching element exceeds a first threshold.

6 Claims, 5 Drawing Sheets

(51) Int. Cl.
*H02M 1/08* (2006.01)
*H02M 1/32* (2007.01)
*H03K 17/567* (2006.01)
*H03K 17/687* (2006.01)
*H02M 1/00* (2006.01)
*H03K 17/16* (2006.01)

(52) U.S. Cl.
CPC ......... *H03K 17/168* (2013.01); *H03K 17/567* (2013.01); *H03K 17/687* (2013.01); *H03K 17/6877* (2013.01); *H02M 2001/0009* (2013.01); *H02M 2001/0029* (2013.01); *H03K 17/163* (2013.01)

(56) References Cited

U.S. PATENT DOCUMENTS

| | | | | |
|---|---|---|---|---|
| 7,675,346 | B2* | 3/2010 | Kesler | F02P 3/053 327/108 |
| 8,222,846 | B2* | 7/2012 | Sugie | H02P 6/085 318/379 |
| 9,431,386 | B2* | 8/2016 | Zhang | G01R 19/00 |
| 2003/0001630 | A1 | 1/2003 | Sakata et al. | |
| 2003/0206039 | A1 | 11/2003 | Sakata et al. | |
| 2003/0206040 | A1 | 11/2003 | Sakata et al. | |
| 2006/0017466 | A1* | 1/2006 | Bryson | H03F 3/2171 326/88 |
| 2006/0181831 | A1 | 8/2006 | Kojima | |
| 2007/0085133 | A1* | 4/2007 | Kirchmeier | H01S 3/097 257/321 |
| 2012/0013370 | A1 | 1/2012 | Mori | |
| 2012/0075761 | A1 | 3/2012 | Miura et al. | |
| 2013/0214823 | A1 | 8/2013 | Kawamoto et al. | |
| 2013/0249602 | A1* | 9/2013 | Mauder | H01L 29/7801 327/108 |
| 2014/0062558 | A1* | 3/2014 | Kinjou | H03K 5/12 327/170 |
| 2015/0048718 | A1* | 2/2015 | Etzler | F02D 41/2096 310/318 |
| 2015/0061461 | A1* | 3/2015 | Schrod | F02D 41/2096 310/316.03 |
| 2015/0318848 | A1* | 11/2015 | Kandah | H02M 1/32 363/132 |
| 2016/0087622 | A1* | 3/2016 | Kaeriyama | H03K 17/0828 327/109 |
| 2016/0087626 | A1* | 3/2016 | Kaeriyama | G01R 19/0092 327/109 |
| 2016/0163615 | A1* | 6/2016 | Mitamura | H01L 27/0664 257/140 |
| 2016/0231358 | A1* | 8/2016 | Wasekura | H03K 17/0828 |
| 2016/0233789 | A1* | 8/2016 | Onishi | H02M 7/5387 |
| 2016/0233856 | A1* | 8/2016 | Wasekura | H03K 17/0828 |
| 2016/0269007 | A1* | 9/2016 | Wasekura | H03K 17/0828 |

FOREIGN PATENT DOCUMENTS

| | | |
|---|---|---|
| JP | 2010-154595 A | 7/2010 |
| JP | 2012-105088 A | 5/2012 |
| JP | 2012-227825 A | 11/2012 |

* cited by examiner

DRIVE DEVICE

CROSS REFERENCE TO RELATED APPLICATIONS

This application is a U.S. national stage of International Application No. PCT/JP2015/001366 filed on Mar. 12, 2015 and is based on Japanese Patent Application No. 2014-66597 filed on Mar. 27, 2014, the disclosures of which are incorporated herein by reference.

TECHNICAL FIELD

The present disclosure relates to a drive device that performs on/off control and protection in an abnormal condition for a power switching element.

BACKGROUND ART

When a load which is driven by a power switching element is short-circuited, an excessively large current rapidly flows through the power switching element. Various circuits for protecting the power switching element from the overcurrent have been proposed. However, in a drive circuit provided with such a protection circuit, the protection circuit erroneously operates, for example, due to a switching noise of the power switching element, which disadvantageously results in an unintended stop of the drive of the power switching element.

On the other hand, a protection circuit described in Patent Literature 1 reduces a gate voltage of a power switching element by resistance voltage division to reduce a current when a short circuit of a load is detected. Further, when a current higher than a short-circuit detection threshold continuously flows for a predetermined time, the protection circuits determines a short circuit of the load and stops the drive of the power switching element.

However, in the protection circuit described in Patent Literature 1, the gate voltage is uniformly reduced in the protection against a short circuit. Thus, variations in the threshold voltage caused by manufacture variations in the power switching element produce variations in a current flowing through the power switching element. When a current value falls below the short-circuit detection threshold within the above predetermined time due to the variations in the current value, the short-circuit protection operation is erroneously released. Thus, it is necessary to set a large short-circuit detection threshold to prevent the erroneous release. As a result, the stress on the power switching element increases.

Further, the waveform of the gate voltage is rounded by the resistance for voltage division and the gate capacitance of the power switching element, and the time constant during a gate voltage reduction increases. Thus, a time required for reducing the current of the power switching element increases, which results in a large stress.

On the other hand, a power converter described in Patent Literature 2 employs a method that reduces a gate voltage of a power switching element by a Zener diode when a short circuit is detected.

The method described in Patent Literature 2 can rapidly reduce the gate voltage and thus can solve the problem of the time constant during the gate voltage reduction. However, a Zener diode typically has a large characteristic variation caused by temperature or manufacturing variations. Thus, it is not possible to solve the problem of the erroneous release of the short-circuit protection operation.

Further, it is difficult to control a drop speed of the gate voltage during the gate voltage reduction. Thus, ringing is generated in the current of the power switching element, which results in application of a surge voltage to the power switching element.

Prior Art Literatures

Patent Literature

Patent Literature 1: JP-H3-H3-40517-A
Patent Literature 2: JP-2010-154595-A

SUMMARY OF INVENTION

It is an object of the present disclosure to appropriately control the gate voltage to perform protection when an excessively large current flows due to a short circuit of a load in a drive device that performs on/off control and protection in an abnormal condition for a power switching element.

A drive device includes: an on-side circuit that controls a gate current of a power switching element for driving a load to turn on the power switching element; an off-side circuit connected to a main power supply in series with the on-side circuit to turn off the power switching element, a gate of the power switching element being connected to an intermediate point between the on-side circuit and the off-side circuit; and a protection circuit that controls the gate current of the power switching element based on a current value of a collector current of the power switching element. The protection circuit includes: a constant-current circuit that defines a constant current for drawing a gate charge of the power switching element; a protection switch that controls electrical connection between the constant-current circuit and the gate of the power switching element; and a collector current detector that detects the current value of the collector current of the power switching element exceeding a predetermined threshold. The collector current detector turns off the on-side circuit to disconnect the power switching element from the main power supply, and turns on the protection switch after a predetermined time has elapsed from when the current value of the collector current of the power switching element exceeds a first threshold indicative of a short circuit of the load as the predetermined threshold.

According to this configuration, the constant-current circuit is provided as a destination of a drawn charge when the charge is drawn from the gate of the power switching element to reduce an increase in the collector current caused by a short circuit. Thus, the gate charge of the power switching element is drawn at a constant speed. In other words, it is possible to reduce the gate voltage and, in turn, the collector current at a constant slew rate. Thus, it is possible to reduce waveform rounding in the gate voltage and the collector current and reduce ringing caused by a rapid reduction in the voltage and the current.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION (First Embodiment)

First, a schematic configuration of a drive device according to a first embodiment will be described with reference to FIG. 1.

Figure 1:
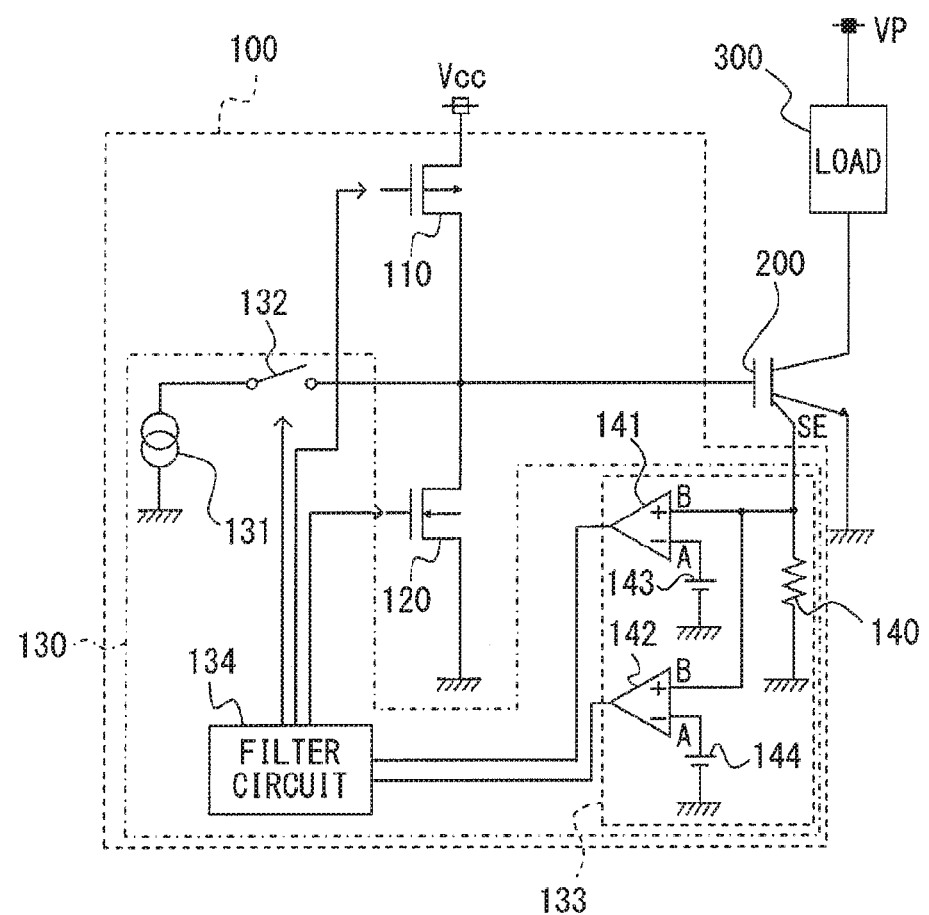
FIG. 1 is a circuit diagram illustrating a schematic configuration of a drive device according to a first embodiment.

As illustrated in FIG. 1, the drive device 100 controls the drive of an insulated gate bipolar transistor (IGBT) 200 as a power switching element which drives a load 300.

The drive device 100 includes an on-side circuit 110, an off-side circuit 120, and a protection circuit 130.

The on-side circuit 110 and the off-side circuit 120 are connected in series between a main power supply and the GND. A gate of the IGBT 200 is connected to an intermediate point between the on-side circuit 110 and the off-side circuit 120. The on-side circuit 110 includes a PMOS transistor. When the PMOS transistor is in an on state, a power supply voltage Vcc is applied to the gate of the IGBT 200, Accordingly, the IGBT 200 is turned on, and a current flows between a collector and an emitter of the IGBT 200, so that power is supplied to the load 300.

The off-side circuit 120 includes an NMOS transistor. When the NMOS transistor is in an on state, a charge is drawn from the gate of the IGBT 200 to turn off the IGBT 200.

The protection circuit 130 controls a gate current of the IGBT 200, and in turn, controls a gate voltage on the basis of a collector current Ic of the IGBT 200. The protection circuit 130 includes a constant-current circuit 131 for drawing a gate charge of the IGBT 200 at a constant ratio, a protection switch 132 which controls electrical connection between the constant-current circuit 131 and the IGBT 200 to define enabling/disabling of the constant-current circuit 131, and a collector current detector 133 which detects the collector current Ic of the IGBT 200.

The collector current detector 133 is a circuit that detects an abnormality in the collector current of the IGBT 200 caused by a short circuit of the load 300. The collector current detector 133 includes a resistor 140 for converting the collector current Ic of the IGBT 200 into a voltage, comparators 141, 142, and voltage sources 143, 144 which apply a voltage to be a threshold to input terminals A of the comparators 141, 142.

More specifically, as illustrated in FIG. 1, the voltage source 143 is connected to one input terminal A of the comparator 141. The other input terminal B of the comparator 141 is connected to an intermediate point between a sense emitter terminal SE of the IGBT 200 and the resistor 140 which is connected between the sense emitter terminal SE and the GND. That is, a voltage corresponding to a current flowing from the sense emitter terminal SE of the IGBT 200 toward the GND and a resistance value of the resistor 140 is applied to the input terminal B of the comparator 141. The voltage applied to the input terminal B is proportional to the current flowing from the sense emitter terminal SE toward the GND. That is, this voltage increases as the collector current of the IGBT 200 increases.

The comparator 141 outputs a control signal so as to turn on the protection switch 132 and turn off the on-side circuit 110 through a filter circuit 134 (described below) when the voltage corresponding to the current flowing through the sense emitter terminal SE exceeds the voltage of the voltage source 143, that is, when the collector current Ic exceeds a predetermined threshold (a first threshold indicating a short circuit of the load 300).

The comparator 142 has the same configuration as the comparator 141. Specifically, a voltage source 144 is connected to one input terminal A of the comparator 142. The other input terminal B of the comparator 142 is connected to an intermediate point between the sense emitter terminal SE of the IGBT 200 and the resistor 140 which is connected between the sense emitter terminal SE and the GND.

The comparator 142 outputs a control signal so as to turn off the protection switch 132 through the filter circuit 134 when the voltage corresponding to the current flowing through the sense emitter terminal SE exceeds the voltage of the voltage source 144, that is, when the collector current Ic exceeds a predetermined threshold (corresponding to a second threshold).

As described above, a voltage that produces a determination of a short-circuit state of the load 300 for the IGBT 200 is set at the voltage source 143 to define the first threshold. A voltage higher than the first threshold is set at the voltage source 144 to define the second threshold.

When a signal is input, the filter circuit 134 described above outputs a control signal corresponding to the input after the elapse of a preset predetermined filter time from the input of the signal.

For example, when the collector current Ic of the IGBT 200 exceeds the first threshold, the filter circuit 134 in the present embodiment outputs a control signal so as to turn on the off-side circuit 120 after the elapse of a preset first filter time. In addition, when the collector current of the IGBT 200 exceeds the first threshold, the filter circuit 134 outputs a control signal so as to turn on the protection switch 132 and turn off the on-side circuit 110 after the elapse of a preset second filter time.

Further, when the collector current Ic of the IGBT 200 reaches the second threshold from a state higher than the second threshold, the filter circuit 134 in the present embodiment outputs a control signal so as to turn off the protection switch 132 after the elapse of a preset third filter time. In the following description for the operation of the drive device 100, the third filter time is set to zero for convenience. That is, the filter circuit 134 outputs a control signal so as to turn off the protection switch 132 upon the collector current Ic of the IGBT 200 reaching the second threshold from a state higher than the second threshold.

The filter circuit 134 is provided for preventing the protection circuit 130 from erroneously operating by, for example, a switching noise of the IGBT 200.

Figure 2:
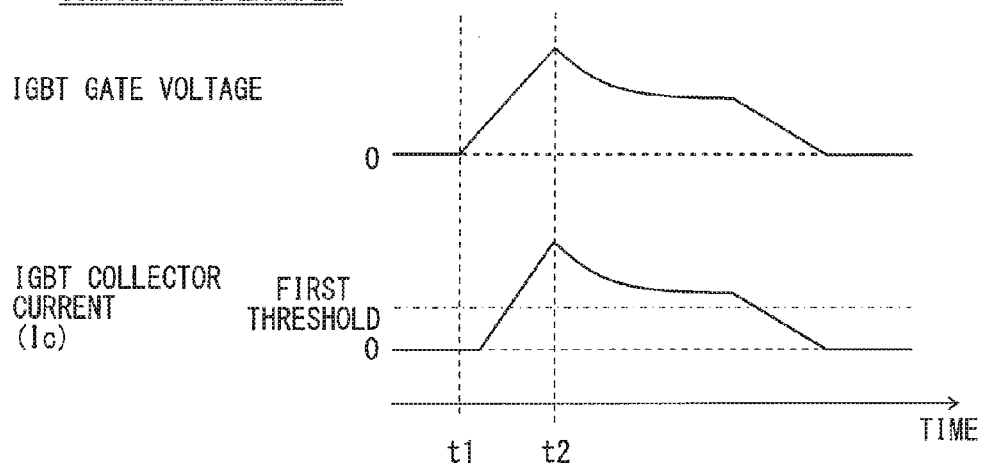
FIG. 2 is a timing chart illustrating driving by a drive device in a conventional configuration.
Figure 3:
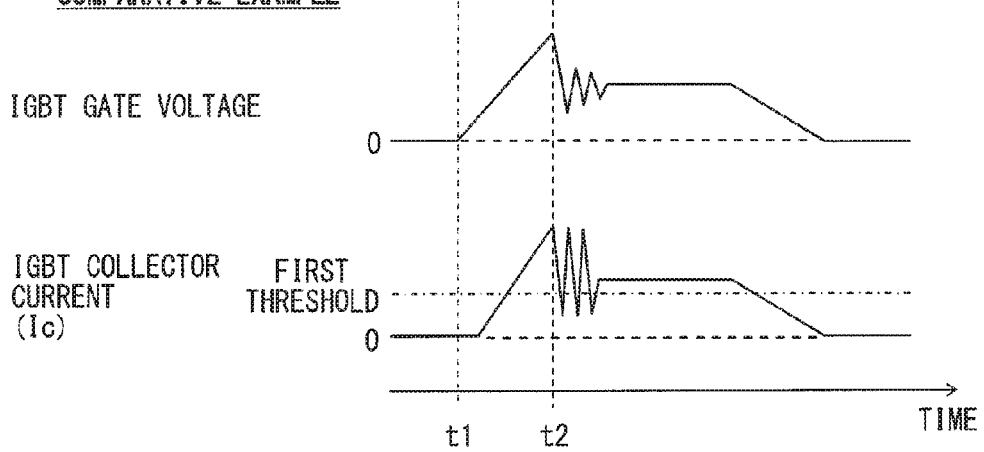
FIG. 3 is a timing chart illustrating driving by a drive device in a conventional configuration.

Next, the operation and effects of the drive device 100 according to the present embodiment will be described with reference to FIGS. 2 to 4.

First, the behavior when a protection operation for the IGBT 200 is performed in prior art will be described.

The protection circuit described in Patent Literature 1 employs a method that defines a value of the gate voltage after being reduced by resistance voltage division. Thus, as illustrated in FIG. 2, even when the protection circuit operates and the gate voltage starts decreasing at a time t2, a large collector current Ic is maintained due to a long time constant. As a result, the stress on the IGBT 200 increases. Further, since a value of the gate voltage is defined at a constant value by the resistance voltage division, variations in the gate current occur due to variations in the gate capacitance of the IGBT 200.

The power converter described in Patent Literature 2 employs a method that defines a value of the gate voltage by a Zener diode. Thus, as illustrated in FIG. 3, when the protection circuit operates at a time t2, the gate voltage rapidly decreases, which generates ringing in the gate voltage and the collector current Ic. When the ringing is generated in the collector current Ic, a large surge voltage is applied to the collector voltage.

Next, the behavior when the protection operation by the drive device 100 according to the present embodiment is performed will be described with reference to FIG. 4.

Figure 4:
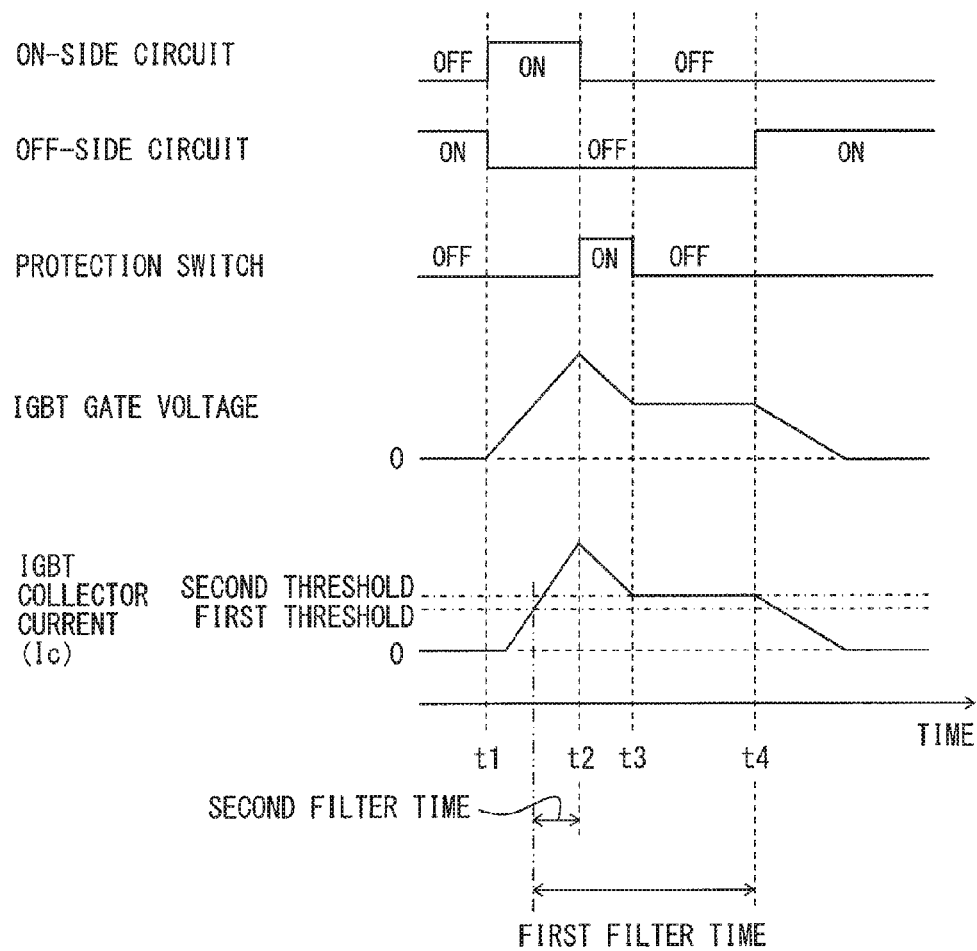
FIG. 4 is a timing chart illustrating driving by the drive device according to the first embodiment.

In FIG. 4, the IGBT 200 is in an off state before a time t1. That is, the off-side circuit 120 is in an on (enabled) state and the on-side circuit 110 is in an off (disabled) state, and no voltage is applied to the gate of the IGBT 200.

At the time t1, when a control signal indicating turning-on of the IGBT 200 is received from a controller (not illustrated), the on-side circuit 110 is turned on and the off-side circuit 120 is turned off in the drive device 100. Accordingly, the gate voltage of the IGBT 200 starts increasing. When the gate voltage exceeds a threshold voltage (Vth) peculiar to the IGBT 200, the collector current Ic starts flowing through the IGBT 200.

When the load 300 has been short-circuited, an excessively large collector current Ic flows through the IGBT 200. When the collector current Ic exceeds the first threshold defined by the voltage source 143, the filter circuit 134 starts counting the first filter time. In the present embodiment, the count of the second filter time is also started simultaneously with the count of the first filter time.

At a time t2, which comes after the elapse of the second filter time from when the collector current Ic exceeds the first threshold, the protection switch 132 is turned on and, at the same time, the on-side circuit 110 is turned off. Accordingly, the gate of the IGBT 200 is disconnected from the main power supply and the GND, and the gate charge is drawn only by the constant-current circuit 131. In other words, the drawing of the charge from the gate is performed at a constant speed by the constant-current circuit 131. Accordingly, it is possible to reduce the gate voltage at a constant slew rate. Thus, it is possible to reduce waveform rounding of the gate voltage and reduce ringing caused by a rapid reduction in the gate voltage.

When the gate current drops from a state higher than the second threshold and reaches the second threshold (time t3) by the drawing of the charge from the gate of the IGBT 200, the protection switch 132 is turned off. Accordingly, the gate of the IGBT 200 becomes an electrically floating state. If the short circuit of the load 300 is false, the collector current Ic falls below the first threshold. Thus, the on-side circuit 110 is turned on, and the IGBT 200 returns to a normal operation. When the short circuit of the load 300 is true, the gate voltage is constant, and the collector current Ic is also maintained at a constant value.

Then, at a time t4, which comes after the elapse of the first filter time from when the collector current Ic exceeds the first threshold, the off-side circuit 120 is turned on, and the IGBT 200 stops operating. Accordingly, the IGBT 200 is protected from an excessively large current.

In this manner, the collector current detector 133 monitors the collector current Ic of the IGBT 200, and the gate is brought into a floating state at the point when the current value of the collector current Ic reaches the second threshold. Thus, it is possible to maintain the collector current Ic constant regardless of variations in the gate capacitance of the IGBT 200. That is, it is possible to reduce the variations in the collector current Ic also after turning off the protection switch 132. Accordingly, the second threshold can be set to a value that is as close as possible to the first threshold. When the second threshold has a value larger than the first threshold, the collector current Ic is maintained in a high state, which increases the stress on the IGBT 200. On the other hand, in the present embodiment, the second threshold can be brought close to the first threshold compared to conventional configurations. Thus, the stress on the IGBT 200 can be reduced.

(First Modification)

In the above first embodiment, the threshold for the collector current Ic includes the first threshold indicating a short circuit of the load 300 and the second threshold which is set to a value higher than the first threshold. Alternatively, a third threshold having a current value higher than the second threshold may be set to improve a noise resistance amount compared to the first embodiment.

Figure 5:
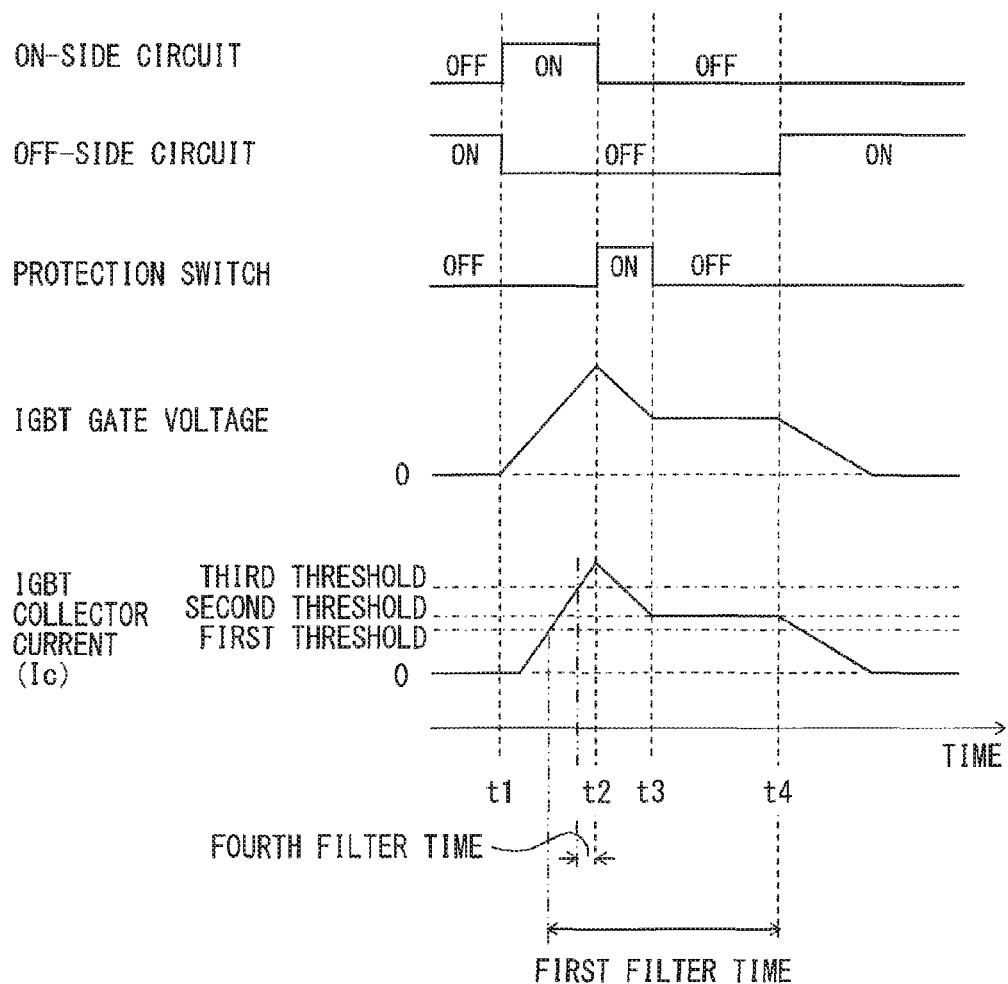
FIG. 5 is a timing chart illustrating driving by a drive device according to a first modification.

In the first embodiment, when the collector current Ic exceeds the first threshold, the count of the first filter time for tuning on the off-side circuit 120 and the count of the second filter time for turning on the protection switch 132 are started. On the other hand, in the present modification, as illustrated in FIG. 5, when the collector current Ic exceeds the first threshold, only the count of the first filter time is started. When the collector current Ic exceeds the third threshold, the count of a fourth filter time for turning on the protection switch 132 is started.

According to this configuration, the threshold for turning on the protection switch 132 for protecting the IGBT 200 is set to the third threshold which is higher than the first threshold and the second threshold. Thus, even when a pulse noise that exceeds the first threshold is generated in the collector current Ic, it is possible to prevent the protection switch 132 from being erroneously turned on. Accordingly, it is possible to improve the noise resistance amount compared to the first embodiment.

(Second Modification)

When the off-side circuit 120 is turned on after the time when the protection switch 132 is turned on, the drive capacity of the off-side circuit 120 is preferably reduced compared to a case when the protection switch 132 has not been turned on. For example, in FIG. 4, when the off-side circuit 120 is turned on at the time t4, which comes after the time t2 when the protection switch 132 is operated, the drive capacity of the off-side circuit 120 is preferably reduced compared to the case when the protection switch 132 is not operated, that is, the case of normal drive having no short circuit of the load 300.

When the load 300 is short-circuited, the collector current Ic of the IGBT 200 largely exceeds a rated value. Thus, when the off-side circuit 120 is turned on with a drive capacity equal to that during a normal operation, the collector voltage may rapidly rise to generate an excessively large surge voltage, which results in a failure in the IGBT 200. As described above, when a short circuit occurs in the load 300 and the protection switch 132 is operated, the surge of the collector voltage can be reduced by reducing the drive capacity of the off-side circuit 120 compared to the case of normal drive having no short circuit of the load 300.

(Third Modification)

When the on-side circuit 110 is turned off to disconnect the IGBT 200 from the main power supply after the elapse of a predetermined time (after the elapse of the second filter time in the first embodiment, for example) from when the current value of the collector current Ic of the IGBT 200 exceeds the first threshold, it is preferred to inject a current that is smaller than a current supplied by the constant-current circuit 131 to the gate of the IGBT 200 from the main power supply without completely turning off the on-side circuit 110.

Specifically, at the time t2 in FIGS. 4 and 5, a voltage near the threshold voltage is applied to the gate of the MOS transistor of the on-side circuit 110 simultaneously with the drawing of the gate charge of the IGBT 200 by the constant-current circuit 131 to supply a minute current to the gate from the main power supply. Accordingly, it is possible to reduce the slew rate of the gate current and the gate voltage to reduce undershoots caused by a reduction in the current and the voltage. Thus, it is possible to reduce variations in the collector current Ic after the time t3 compared to the first embodiment and the modifications thereof.

(Second Embodiment)

In the first embodiment and the modifications thereof, the constant-current circuit 131 of the protection circuit 130 is directly connected to the gate of he IGBT 200 to draw the gate charge. However, the protection circuit 130 may have any configuration that is capable of controlling the gate current of the IGBT 200 on the basis of the collector current Ic.

Figure 6:
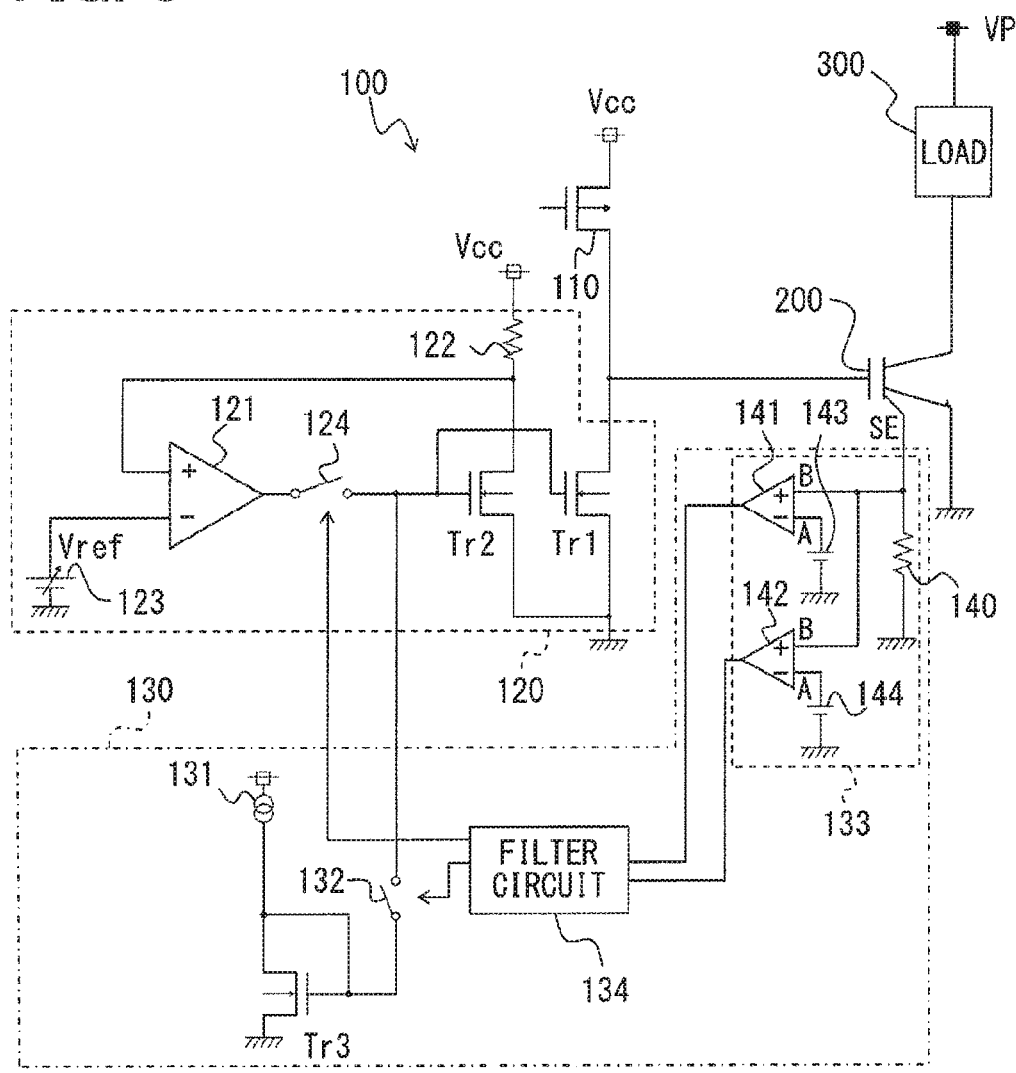
FIG. 6 is a circuit diagram illustrating a schematic configuration of a drive device according to a second embodiment.

For example, as illustrated in FIG. 6, the gate current of the IGBT 200 may be drawn through the off-side circuit 120. Hereinbelow, a detailed description will be made. A collector current detector 133 and a filter circuit 134 of the second embodiment have the same configurations as those of the first embodiment. Thus, description thereof will be omitted.

A drive circuit 100 of the second embodiment includes two NMOS transistors (Tr1, Tr2) in the off-side circuit 120. These NMOS transistors include a main MOS transistor Tr1 as an output transistor and a sense MOS transistor Tr2 which defines a drain current of the main MOS transistor Tr1. In the present embodiment, the main MOS transistor Tr1 constitutes a current mirror with respect to the sense MOS transistor Tr2. Specifically, a gate of the main MOS transistor Tr1 is common with a gate of the sense MOS transistor Tr2, and sources thereof are connected in common to the GND. A drain of the main MOS transistor Tr1 is connected to the gate of the IGBT 200.

In such a configuration, a drain current flows through the main MOS transistor Tr1 with a current ratio that is equal to a size ratio of the sense MOS transistor Tr2.

The off-side circuit 120 includes an operational amplifier 121 for controlling a drain current of the sense MOS transistor Tr2, a reference resistor 122 for defining an output of the operational amplifier 121, and a reference power supply 123 which applies a reference potential Vref to one input terminal of the operational amplifier 121. When a control signal indicating turning-off of the IGBT 200 is input to the operational amplifier 121 from a controller (not illustrated), the operational amplifier 121 applies a voltage to the gate of the sense MOS transistor Tr2 so as to draw a constant current from the gate of the IGBT 200.

The reference resistor 122 is a shunt resistor and defines a current value of the drain current of the sense MOS transistor Tr2. Further, the reference resistor 122 defines a current value of the current drawn from the gate of the IGBT 200. The current drawn from the gate of the IGBT 200 is the drain current flowing through the main MOS transistor Tr1. The main MOS transistor Tr1 constitutes the current mirror together with the sense MOS transistor Tr2. Thus, the current drawn from the gate of the IGBT 200 depends on the drain current of the sense MOS transistor Tr2.

In such a configuration, when a control signal indicating turning-off of the IGBT 200 is input, the operational amplifier 121 is driven to apply a gate voltage to the sense MOS transistor Tr2. A drain current at this time is defined by a resistance value R of the reference resistor 122. The current value is feedback-controlled by adjusting the output of the operational amplifier 121 so that a potential at a connection point between the reference resistor 122 and the sense MOS transistor Tr2 approaches the reference potential Vref. Accordingly, the drain current of the sense MOS transistor Tr2 is controlled at a constant value (=(Vcc−Vref)/R) with high accuracy. Thus, the current drawn from the gate of the IGBT 200 is also maintained at a constant current with high accuracy.

The off-side circuit 120 includes a control switch 124 which turns on and off current supply to the main MOS transistor Tr1 by the operational amplifier 121. When the control switch 124 is in an on state, the gate voltage is applied to the sense MOS transistor Tr2 from the operational amplifier 121 to maintain the off-side circuit 120 in an on state.

The drive device 100 includes a constant-current circuit 131 similarly to the first embodiment. As illustrated in FIG. 6, the constant-current circuit 131 in the present embodiment is connected so as to apply a drain current to an NMOS transistor Tr3 which constitutes a current mirror with the main MOS transistor Tr1 in the off-side circuit 120. A gate of the main MOS transistor Tr1 and a gate of the NMOS transistor Tr3 are connected to each other through a switch. When the switch is in an on state, the main MOS transistor Tr1 and the NMOS transistor Tr3 constitute the current mirror, so that a current defined by the constant-current circuit 131 flows as the drain current of the main MOS transistor Tr1 to draw the gate charge of the IGBT 200. That is, the switch corresponds to the protection switch 132 in the first embodiment and the modifications thereof.

The configuration of the present embodiment enables a single NMOS transistor, that is, the main MOS transistor Tr1 to be shared between the drawing of the gate current from the IGBT 200 for the protection by the protection circuit 130 and the drawing of the gate current from the IGBT 200 for the off operation by the off-side circuit 120.

(Other Embodiments)

Although the preferred embodiments of the present disclose have been described above, the present disclosure is not limited at all to the above embodiments. The present disclosure can be performed with various modifications without departing from the gist of the present disclosure.

The first threshold and the second threshold are preferably set to values corresponding to the collector current of the power switching element previously measured under a constant gate voltage. Although not illustrated, a memory circuit is provided in the drive device 100, and a threshold corresponding to a voltage of the sense emitter terminal SE corresponding to a predetermined collector current Ic of the IGBT 200 measured in a pre-shipment inspection (a characteristic inspection performed after manufacture) for the drive device 100 is stored in the memory. Specifically, the larger the voltage of the sense emitter terminal SE is, the larger values of the first threshold and the second threshold are set. Due to this, it is possible to prevent a malfunction of an erroneous short-circuit protection operation caused by a noise during a normal switching operation. Further, since the second threshold can be set as close as possible to the first threshold, the stress on the IGBT 200 can be reduced.

In each of the above embodiments, the protection operation performed when the load 300 is short-circuited has been described. In addition to this, the present disclosure can also be applied to an overcurrent state in which an excessively large current larger than a rated value of the collector of the IGBT 200 flows although the state is not as serious as the short circuit of the load 300. In this case, the first threshold, the second threshold, and the third threshold are set to values smaller than those in the case of short circuit.

Although, in each of the above embodiments, the IGBT 200 has been described as an example of the power switching element, the present disclosure is not limited to this example. For example, the present disclosure may also be applied to a power MOS transistor or the like as a power switching element.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A drive device comprising:
an on-side circuit that controls a gate current of a power switching element for driving a load to turn on the power switching element;
an off-side circuit connected to a main power supply in series with the on-side circuit to turn off the power switching element, a gate of the power switching element being connected to an intermediate point between the on-side circuit and the off-side circuit; and
a protection circuit that controls the gate current of the power switching element based on a current value of a collector current of the power switching element, wherein:
the protection circuit includes:
a constant-current circuit that defines a constant current for drawing a gate charge of the power switching element;
a protection switch that controls electrical connection between the constant-current circuit and the gate of the power switching element; and
a collector current detector that detects the current value of the collector current of the power switching element exceeding a predetermined threshold;
the collector current detector turns off the on-side circuit to disconnect the power switching element from the main power supply, and turns on the protection switch after a predetermined time has elapsed from when the current value of the collector current of the power switching element exceeds a first threshold indicative of a short circuit of the load as the predetermined threshold;
a second threshold having a current value higher than the first threshold is set as the threshold for the collector current of the power switching element in addition to the first threshold; and
the collector current detector maintains the protection switch in an on state until the collector current of the power switching element transitions from a state higher than the second threshold and reaches the second threshold.

2. The drive device according to claim 1, wherein:
the first threshold is set to a value corresponding to a voltage of a sense emitter terminal of the power switching element, the voltage being preliminary measured under a constant collector current.

3. The drive device according to claim 1, wherein:
the second threshold is set to a value corresponding to a voltage of the sense emitter terminal of the power switching element, the voltage being preliminary measured under a constant collector current.

4. The drive device according to claim 1, wherein:
a third threshold having a current value higher than the first threshold and the second threshold is set as the threshold for the collector current of the power switching element; and
the collector current detector turns on the protection switch after a predetermined filter time has elapsed from when the collector current of the power switching element exceeds the third threshold.

5. The drive device according to claim 1, wherein:
a drive capacity of the off-side circuit is reduced when the off-side circuit is turned on after the protection switching is turned on, compared to a case in which the protection switch is not turned on.

6. The drive device according to claim 1, wherein:
when the on-side circuit is turned off to disconnect the power switching element from the main power supply after a predetermined time has elapsed from when the current value of the collector current of the power switching element exceeds the first threshold, a current smaller than a current supplied by the constant-current circuit in the protection circuit is injected to the gate of the power switching element from the main power supply without completely turning off the on-side circuit.

* * * * *